US006944840B2

(12) United States Patent
Sasaki et al.

(10) Patent No.: US 6,944,840 B2
(45) Date of Patent: Sep. 13, 2005

(54) DESIGN METHOD AND SYSTEM FOR ACHIEVING A MINIMUM MACHINE CYCLE FOR SEMICONDUCTOR INTEGRATED CIRCUITS

(75) Inventors: Tetsuo Sasaki, Hadano (JP); Yousuke Nagao, Hadano (JP); Tatsuki Ishii, Hinode (JP); Itaru Matsumoto, Ebina (JP)

(73) Assignees: Hitachi, Ltd., Tokyo (JP); Hitachi Information Technology Co., Ltd., Ashigarakami-Gun (JP); Hitachi Software Engineering Co., Ltd., Yokohama (JP)

( * ) Notice: Subject to any disclaimer, the term of this patent is extended or adjusted under 35 U.S.C. 154(b) by 260 days.

(21) Appl. No.: 10/073,312

(22) Filed: Feb. 13, 2002

(65) Prior Publication Data

US 2002/0114224 A1 Aug. 22, 2002

(30) Foreign Application Priority Data

Feb. 15, 2001 (JP) ........................................ 2001-038678

(51) Int. Cl.[7] ............................................ G06F 17/50
(52) U.S. Cl. ................................................. 716/6; 716/7
(58) Field of Search .............................. 716/8, 1–5, 6, 716/7–15

(56) References Cited

U.S. PATENT DOCUMENTS

| 5,481,209 | A | * | 1/1996 | Lim et al. ..................... 326/93 |
| 5,519,351 | A | * | 5/1996 | Matsumoto ................ 327/295 |
| 6,233,724 | B1 | * | 5/2001 | LaBerge ...................... 716/18 |
| 6,305,001 | B1 | * | 10/2001 | Graef .......................... 716/12 |
| 6,351,840 | B1 | * | 2/2002 | Teng ............................. 716/7 |
| 6,353,352 | B1 | * | 3/2002 | Sharpe-Geisler ............ 327/295 |
| 6,367,060 | B1 | * | 4/2002 | Cheng et al. ................. 716/10 |
| 6,434,731 | B1 | * | 8/2002 | Brennan et al. .............. 716/10 |
| 6,502,222 | B1 | * | 12/2002 | Tetelbaum ..................... 716/4 |
| 2001/0010092 | A1 | * | 7/2001 | Kato ............................ 716/10 |
| 2002/0060595 | A1 | * | 5/2002 | Nakano ...................... 327/295 |

OTHER PUBLICATIONS

A. Takahashi et al, "Performance and Reliability Driven Clock Scheduling of Sequential Logic Circuits", Proceedings of the ASP–DAC '97, 1997, pp. 37–42.

K. Inoue et al, "Schedule–Clock–Tree Routing for Semi–Synchronous Circuits", Technical Report of IEICE, CAD21, 1998, pp. 54–61.

* cited by examiner

*Primary Examiner*—Stacy A. Whitmore
*Assistant Examiner*—Magid Y. Dimyan
(74) *Attorney, Agent, or Firm*—Mattingly, Stanger, Malur & Brondidge, P.C.

(57) ABSTRACT

Each flip-flop-to-flip-flop path delay and a target machine cycle obtained in the stages of physical design and packaging design are used as input, and with respect to a path in which the path delay is not less than the target machine cycle, a closed loop including the path is extracted, and the timing of a clock signal of each flip-flop is adjusted so as to permit data transmission along the closed loop in a required cycle-number. At this time, a path along which data transmission is impossible in the target machine cycle or a closed loop including the path is listed in order to be modified. As methods of supplying a clock signal to each flip-flop, a plurality of methods different in the adjustable range of clock timing are combined and used.

10 Claims, 7 Drawing Sheets

201 DETOUR WIRING

202 DELAY ELEMENT

203 NETWORK HAVING MANY FAN OUTS

204 FINAL STAGE AMPLIFIER OF DELY TYPE

301
FINAL CLOCK AMPLIFIER OF
ADJACENT CLOCK-FED AREA

DELAY ELEMENT
202

201
DETOUR WIRING

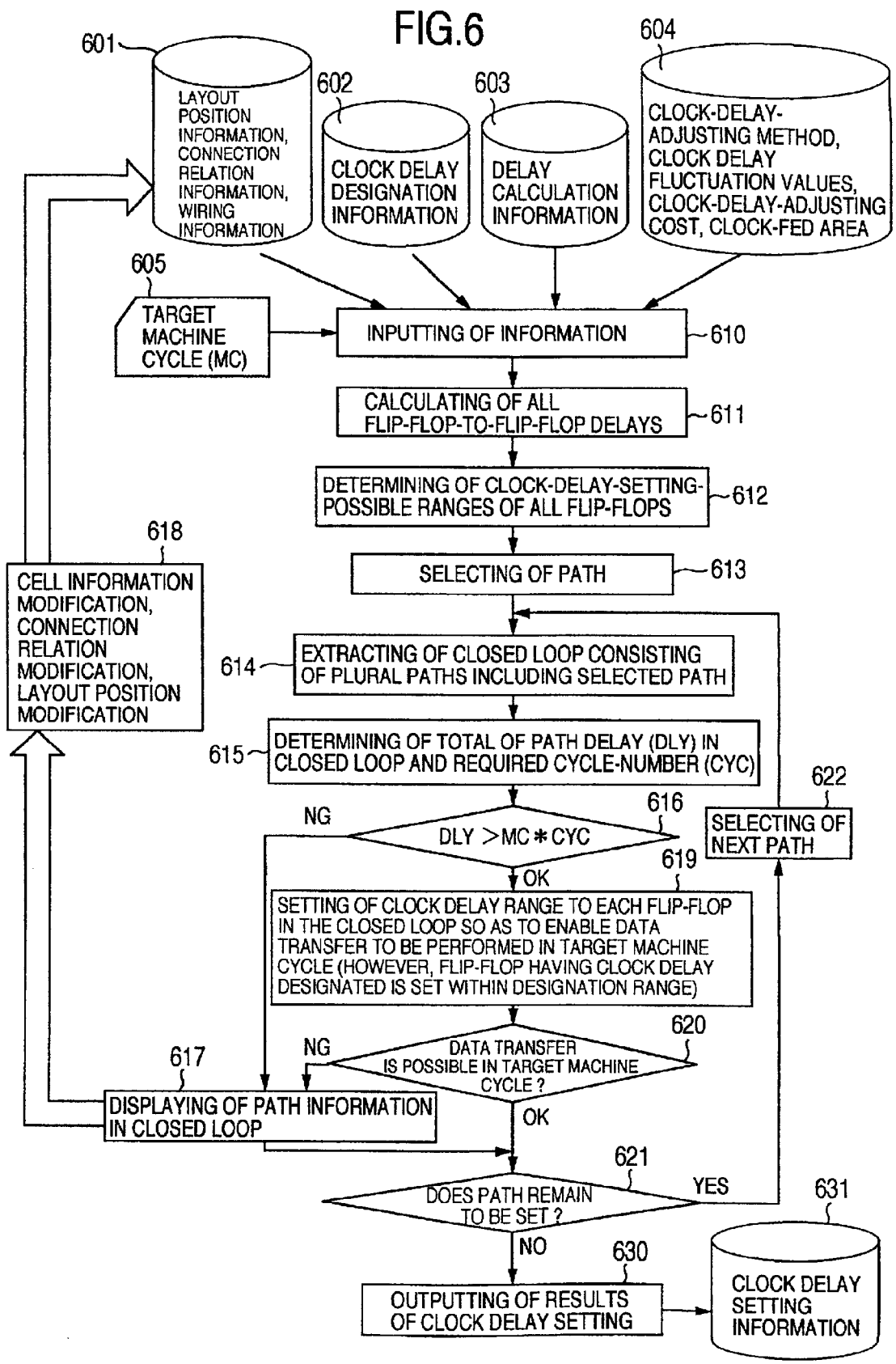

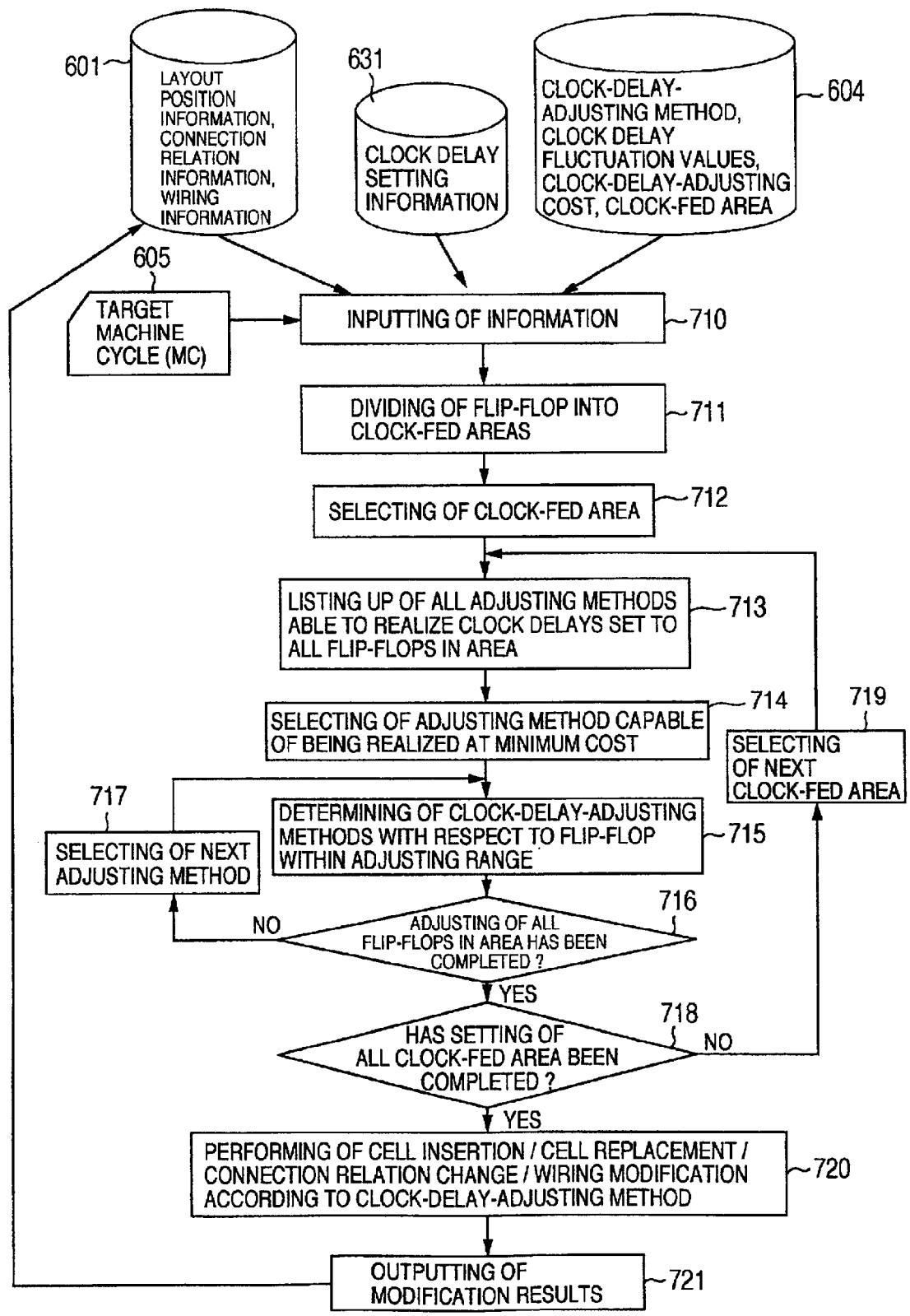

DESIGN METHOD AND SYSTEM FOR ACHIEVING A MINIMUM MACHINE CYCLE FOR SEMICONDUCTOR INTEGRATED CIRCUITS

BACKGROUND OF THE INVENTION

The invention relates to a design method and a design system for semiconductor integrated circuits, and particularly relates to a design method and a design system for semiconductor integrated circuits permitting realization of a minimum machine cycle while minimizing the number of man-hours and the amount of changes of physical design and modifications of packaging design.

As a prior art pertaining to a method for adjusting the clock timing of flip-flops to reduce machine cycles, for example, a technology is known which is described in A. TAKAHASHI AND Y. KAJITANI, "PERFORMANCE AND RELIABILITY DRIVEN CLOCK SCHEDULING OF SEQUENTIAL LOGIC CIRCUITS," IN PROC. ASP-DAC '97, PP. 37 to 42, 1997. In this first prior art, when flip-flop-to-flip-flop signal propagation delay time (hereinafter, referred to as a path delay) is given, timing of a clock signal inputting to each flip-flop can be changed within the range in which the timing can be changed by using signal propagation in the flip-flop-to-flip-flop signal propagation path (hereinafter, referred to as a path), thereby enabling the clock period to be made shorter than the maximum value of the signal delay time of the path.

Also, as a prior art pertaining to a method of adjusting clock timing of flip-flops, there is known a technology reported by "Schedule-Clock-Tree Routing for Semi-Synchronous Circuits" (PP. 54 to 61) in "CAD21 result report of the fiscal year 1998" (TOKYO Institute of Technology CAD21 Research Body), for example. In this second prior art, with respect to the algorithm of so-called ZERO-SKEW CLOCK-TREE ROUTING, when a difference of clock timing exists between two flip-flops, cost is defined as the length of detour wiring needed for adjusting the delay difference and an increment in wiring length by connecting a flip-flop that is at remote distance but has a small difference of clock timing. Then, two flip-flops making this cost minimum are coupled. Herein, in the algorithm of ZERO-SKEW CLOCK-TREE ROUTING, two flip-flops located at the shortest distance are coupled, and then connected to a clock source pin that is at the distance shortest from a set of midpoints between the coupled flip-flops.

SUMMARY OF THE INVENTION

When the prior arts described above are used to speed up semiconductor integrated circuits, there have been problems described below.

First, a first problem is in that the number of man-hours in design becomes large. That is, in the first prior art described above, when path delays are given, clock timing of each flip-flop is adjusted such that, even if a clock period is made shorter than the maximum path delay, a signal can be grabbed. At this time, the limitation of the clock period is determined by a closed loop having the largest ratio among the ratios of the total signal propagation delay time in closed loops consisting of a plurality of paths to the number of cycles required for data transmission along the closed loops. When such a prior art is used to speed up a given circuit, the design is performed in such a manner that first, assuming the given circuit to be a synchronous circuit, the design is proceeded until individual path delays become near a target machine cycle, and thereafter, assuming that the given circuit is a semi-synchronous circuit, the clock timing of each flip-flop is adjusted to minimize the clock period. Then, if the determined clock period is larger than the target machine cycle, a design change is performed so as to reduce delay time of a path on the closed loop that has determined the clock period. These are repeated until the clock period reaches the target machine cycle.

For this reason, the first prior art described above must take measures against each of the paths on the closed loop that have determined the clock period, one-by-one. Thus, this prior art has a problem that it requires very much time to reach the target machine cycle and the very large number of man-hours for packaging design.

Also, when the first prior art described above assumes the given circuit to be a synchronous circuit and is bringing individual path delays near to the target machine cycle, it more rapidly reaches convergence by taking measures against more paths. However, this leads to the result that when the first prior art assumes that the given circuit is a semi-synchronous circuit, it may find many paths for which design changes to reduce delay time have been unnecessary. Thus, the first prior art has a problem that it requires an increased number of man-hours in design needed for changes of physical design such as reduction of logic stages and reduction of the number of fan-outs on the paths with respect to the many paths or for modifications in packaging design such as modifications of cell layouts and wiring patterns.

A second problem is the following problems concerning the method of adjusting clock timing of flip-flops.

(1) When a difference of clock timing exists between two flip-flops, the second prior art described above provides detour wiring for adjusting the delay difference, but a fluctuation portion of delay caused by the detour wiring is different depending on the distance from a clock source pin to the detour wiring. Therefore, in the method of performing processing in a bottom-up manner as the prior art, there is a problem that, at the point when the clock tree wiring is completed and connections have been performed to the clock source pin, if the detour wiring exists midway, the delay adjustment value of the estimated detour wiring may be changed. This change becomes larger as the number of flip-flops increases and the wiring length of clock signals becomes longer.

(2) Since the second prior art described above makes a connection from the clock source pin to the midpoint between the flip-flops with one signal wiring, the length of the signal wiring becomes very long and therefore the delay value also becomes large. Also, the fluctuation portion of delay resulting from the micromaching accuracy of wiring width in semiconductor integrated circuits becomes large according to the wiring length, thus making it difficult to design high-speed semiconductor integrated circuits.

(3) On the other hand, in order to shorten the wiring length to the clock source pin, it is easily considered to divide a semiconductor integrated circuit into a plurality of areas. However, in this case, although it is possible to match clock timing among flip-flops in an area, delay values (hereinafter, referred to as clock delay) from the clock source pin to flip-flops are different in each area due to the different numbers of flip-flops and the required degrees of variations of clock timing among the areas.

(4) Further, if another signal wiring passes through a wiring channel adjacent to a wiring pattern, parallel-wiring capacitance is created between both lines of wiring to increase delay. Then, as the wiring length from a clock source pin to the midpoint of flip-flops becomes longer, the parallel-wiring capacitance also becomes larger, thus increasing the delay values. Also, the existence of local crowding density of wiring lines causes differences in the timing of a clock reaching to each flip-flop.

The second prior art described above has a problem of causing large errors from the target clock timing of adjusting because the prior art has the above described problems with respect to the method of adjusting clock timing of flip-flops.

The object of the present invention is to resolve the above problems of prior arts and to provide a design method and a design system of semiconductor integrated circuits, which permit realization of a minimum machine cycle while minimizing the number of man-hours and the amount of materials needed for changes of physical design and modifications of packaging design in semiconductor integrated circuits.

According to the present invention, the above described object can be achieved by a design method of a semiconductor integrated circuit, dividing a chip of a semiconductor integrated circuit into a number of areas and thus providing a plurality of clock pins for each of the areas, performing the distribution of a clock signal from a clock source pin to each of the areas in a transmission form that is of high-speed and resistant to noise or the like, and performing adjustment of clock timing for each flip-flop in the semiconductor integrated circuit such that flip-flop-to-flip-flop data transmission can be performed in a target machine cycle, wherein, as methods of adjusting timing of the clock signal inputting to the above described flip-flop, a plurality of methods having different adjustable ranges are used, and the flip-flops are grouped for each clock timing required by each flip-flop in the above described area, and the above described grouped flip-flops are adjusted in clock timing in accordance with requirement of each flip-flop and connected to separate clock pins.

Also, the above described object can be attained by providing the above described obtained clock timing of each flip-flop, and, according to maximum delay time, minimum delay time and the target machine cycle which are required for data transmission along each flip-flop-to-flip-flop signal propagation path, extracting a closed loop consisting of a plurality of signal propagation paths, and, with respect to each flip-flop on said closed loop, selecting a clock timing of each flip-flop from among clock timing that each flip-flop can adopt such that data transmission can be performed target machine cycle and cycle number required for data transmission along the above described closed loop.

Also, the above described object can be attained by, only when the required clock timing is out of the selecting range and when data transmission is impossible in the target machine cycle, listing the flip-flop-to-flip-flop signal propagation path concerned or a closed loop including the path and taking measures in physical design and packaging design.

Other objects, features and advantages of the invention will become apparent from the following description of the embodiments of the invention taken in conjunction with the accompanying drawings.

BRIEF DESCRIPTION OF THE DRAWINGS

FIG. 6 is a flow chart illustrating processing operations in a method of designing semiconductor integrated circuits according to one embodiment of the present invention; and FIG. 7 is a flow chart illustrating the processing operations for adjusting clock delay of each flip-flop at minimum cost.

DETAILED DESCRIPTION OF THE EMBODIMENTS

Hereinafter, one embodiment of the method of designing semiconductor integrated circuits according to the present invention will be described in detail with reference to the drawings.

Figure 1:
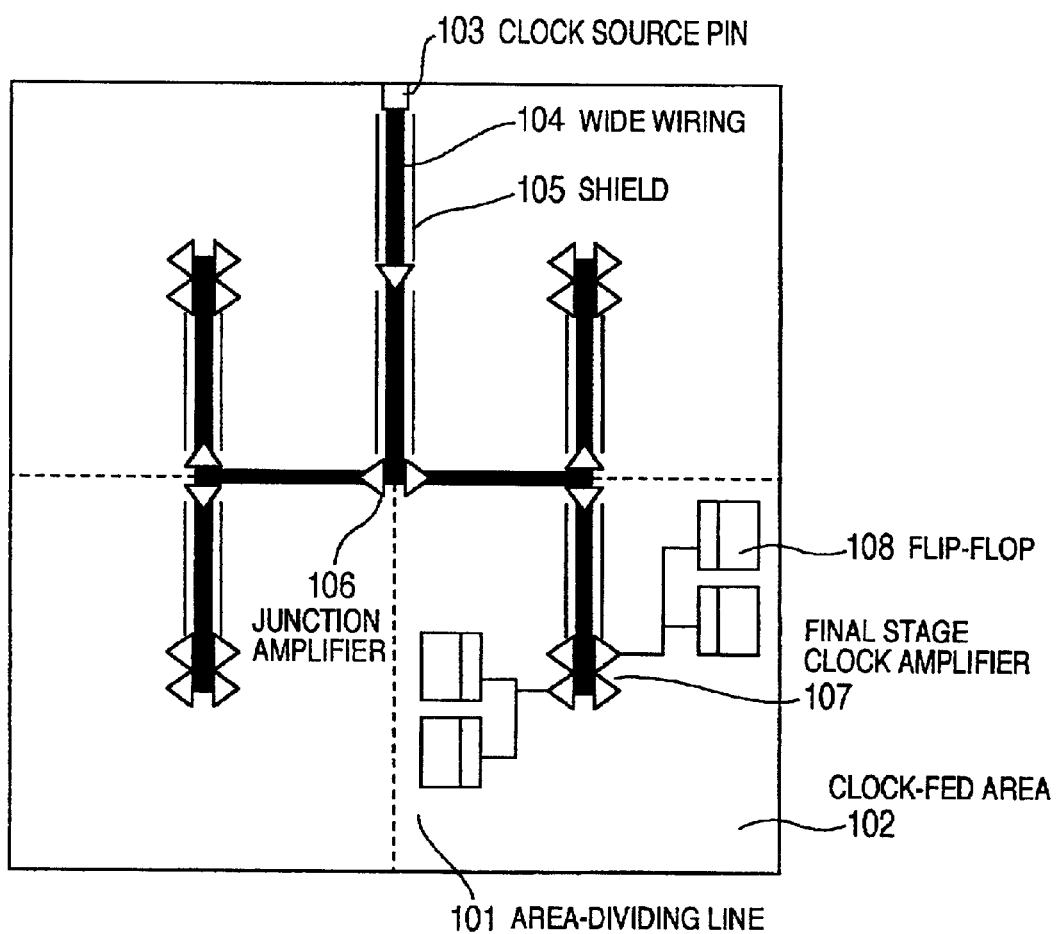
FIG. 1 is a diagram illustrating an example of a basic structure of a distributing circuit of clock signals in semiconductor integrated circuits to which the present invention is applied.

As shown in FIG. 1, a semiconductor integrated circuit to which the present invention is applied is configured such that the semiconductor chip is divided into a number of clock-fed areas 102 by a vertical or horizontal or both area-dividing lines 101. Although FIG. 1 shows an example of the chip divided into four clock-fed areas, the number of clock-fed areas can be arbitrary. Then, clock signals are distributed from a clock source pin 103 provided at one given point on the semiconductor chip into each of the clock-fed areas. Delays from the clock source pin 103 to final stage clock amplifiers 107 in each clock-fed area 102 are set to be fastest and to enable a signal to reach to all final stage clock amplifiers 107 at the same time.

For this reason, the distributing circuit of clock signals shown in the drawing is provided with junction amplifiers 106 in the course of wiring, and is provided with wide wiring 104 used as wiring between clock amplifiers to reduce delay caused by wiring resistance and to reduce a fluctuation portion of delay resulting from micro-machining accuracy. Further, in order to suppress an increase in parallel-wiring capacitance caused by another signal wiring passing through an adjacent wiring channel, the adjacent wiring channel is given a shield 105 as required. Each clock-fed area 102 is provided with one or more than one clock pin according to the size of the area. Then, a plurality of flip-flops 108 existing in the areas are grouped such that the flip-flops 108 may be arranged to have a uniform wiring length and then flip-flops resultantly located near to each other may be gathered together as a group, and are thus connected to clock final stage amplifiers 107. The providing of a plurality of clock pins permits adjusting of delay even in the case where flip-flops requiring different clock timing exist in the same area, and can further absorb variations in the number of flip-flops among the areas.

Next, referring to FIGS. 2A to 2D and FIGS. 3A to 3B, methods of increasing clock delay, i.e. delaying will be described.

Figure 2A:
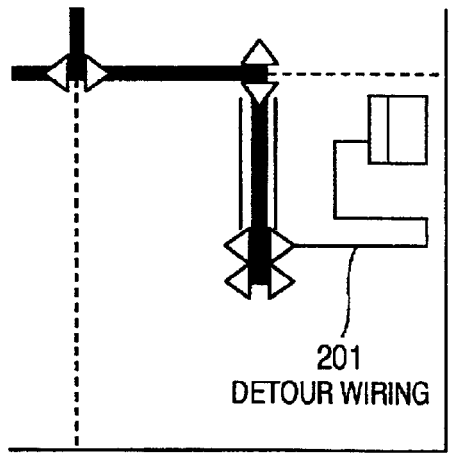
FIGS. 2A to 2D are diagrams illustrating examples of methods of delaying a clock timing of flip-flops.

In the example shown in FIG. 2A, wiring from a final stage clock amplifier to a flip-flop is carried out as detour wiring 201 to adjust delay according to its wiring length. In the example shown in FIG. 2B, a delay element 202 is inserted in between a final stage clock amplifier and a flip-flop to adjust delay using this delay element 202. In the example shown in FIG. 2C, when a large number of flip-flops require a large clock delay, the number of flip-flops included in one group is made large and thus a connection between a final stage clock amplifier and the plurality of flip-flops are made through a network 203 having many fan-outs. Thus, in this example, delay is adjusted not only by increasing wiring length but also by increasing pin capacitance of the clock input pins of the flip-flops. In the example shown in FIG. 2D, a final stage clock amplifier is configured as a delay type of final stage amplifier 204 causing large delay so as to adjust delay. In the example shown in FIG. 3A, a clock signal is fed from a final stage amplifier 301 of an adjacent clock-fed area so as to extend the wiring length, thereby adjusting delay. Also, in the example shown in FIG. 3B, a network from a final stage clock amplifier to a flip-flop is carried out as a detour wiring 201 and also has the delay element 202 inserted therein, thereby adjusting delay with the wiring length and the delay element 202.

Next, referring to FIGS. 4A to 4C, methods of decreasing clock delay, i.e. speeding up clocks will be described.

Figure 4A:
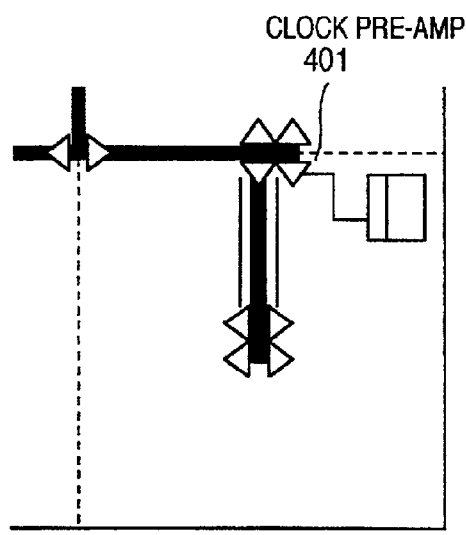
FIGS. 4A to 4C are diagrams illustrating examples of methods of making the clock timing of the flip-flops earlier.
Figure 4B:
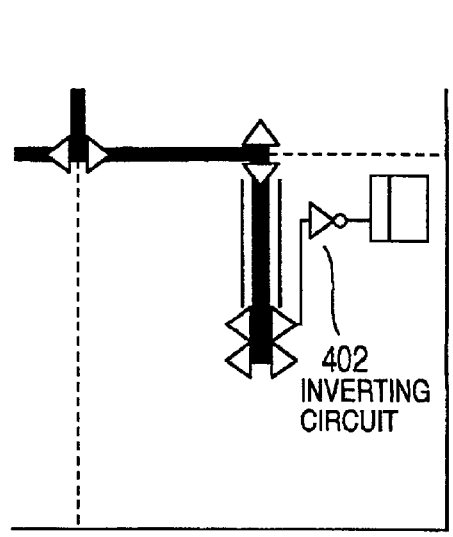
Figure 4C:
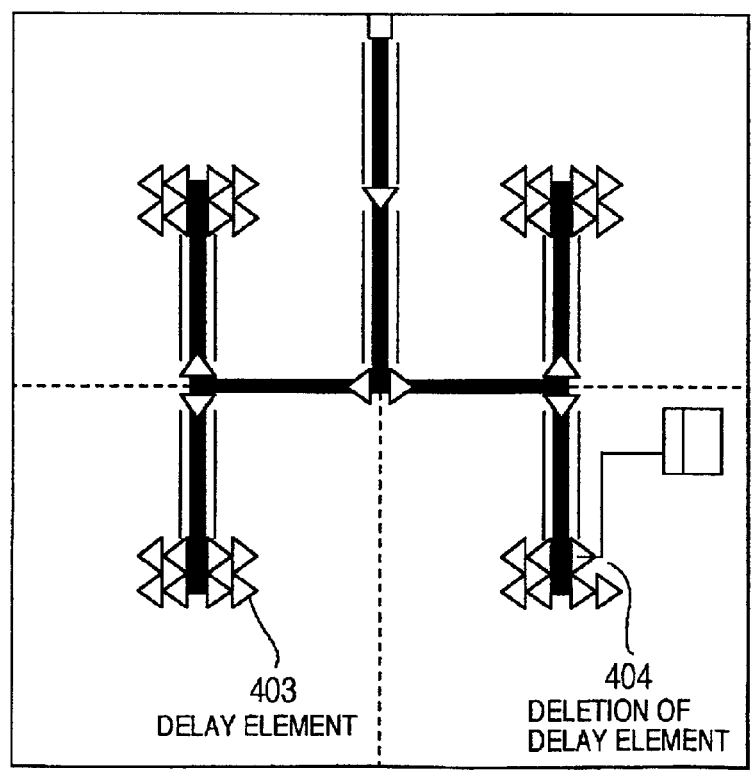

In the example shown in FIG. 4A, the clock-feeding to flip-flops in a clock-fed area is performed not from a final stage amplifier but from a junction amplifier one stage before the final stage, thereby making delay smaller than clock-feeding from a final stage amplifier. In the example shown in FIG. 4B, an inverting circuit 402 is inserted in between a final stage clock amplifier and a flip-flop to invert a clock signal, and thus the clock is sped up by a width of one clock pulse. Also, in the example shown in FIG. 4C, clock final stage amplifiers in the whole clock-fed areas have been in advance made to be of large delay and only a given final stage amplifier in a given clock-fed area is replaced with a amplifier 404 causing small delay, thereby decreasing clock delay as compared with that of the other areas.

Next, referring to FIGS. 5A to 5B, when the clock-adjusting methods described with reference to FIGS. 2A to 4C are applied to the distributing circuit of a clock signal shown in FIG. 1, the adjustable ranges of clock delay, that is, the adjustable ranges of clock timing will be described.

Figure 5A:
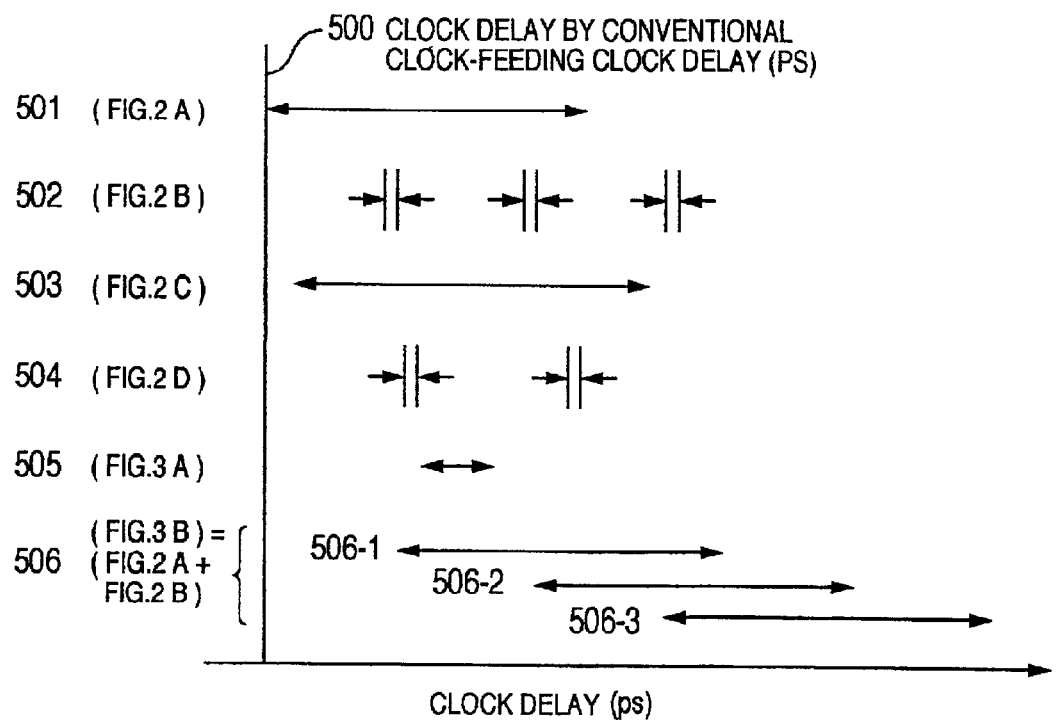
FIGS. 5A to 5B are diagrams showing adjustable ranges of the clock timing in case of applying the clock-adjusting methods shown in FIG. 2 to 4 to the distributing circuit of clock signals shown in FIG. 1.

FIG. 5A shows the adjustable ranges of clock delay corresponding to each of the methods of increasing clock delay described with reference to FIGS. 2A to 2D and FIGS. 3A to 3B. Therein, the adjustable ranges are within the ranges indicated by arrows, which are shown relative to clock delay in a conventional feeding method denoted as reference numeral 500. In FIG. 5A, reference numeral 501 denotes an adjustable range by the method shown in FIG. 2A, and the adjustable range can be controlled by changing a limit to the length of detour wiring. Reference numeral 502 denotes an adjustable range by the method shown in FIG. 2B, and clock delay can be controlled by discretely delaying a clock according to the number of delay elements. Reference numeral 503 denotes an adjustable range by the method shown in FIG. 2C, and clock delay can be controlled by discretely delaying a clock according to the number of flip-flops. Reference numeral 504 denotes an adjustable range by the method shown in FIG. 2D, and clock delay can be controlled by discretely delaying a clock by providing a plurality of kinds of final stage amplifiers which are different in time to delay the clock. Reference numeral 505 denotes an adjustable range by the method shown in FIG. 3A, and a time length of clock delay is determined by changing the size of a clock-fed area and the selecting an adjacent area.

Figure 2B:
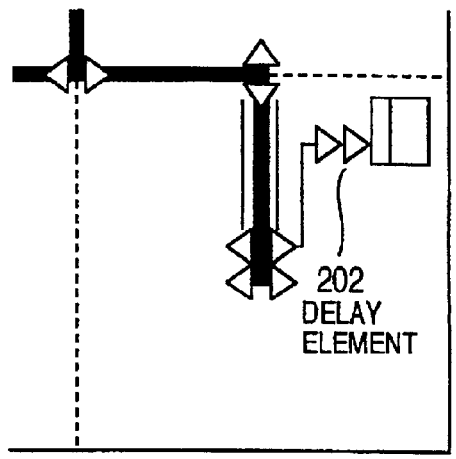
Figure 2C:
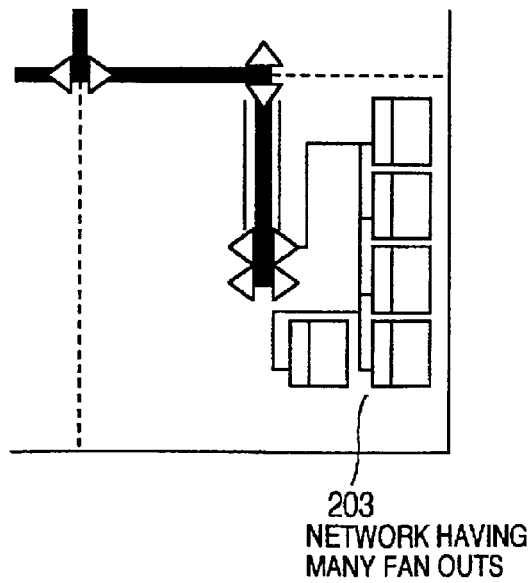
Figure 2D:
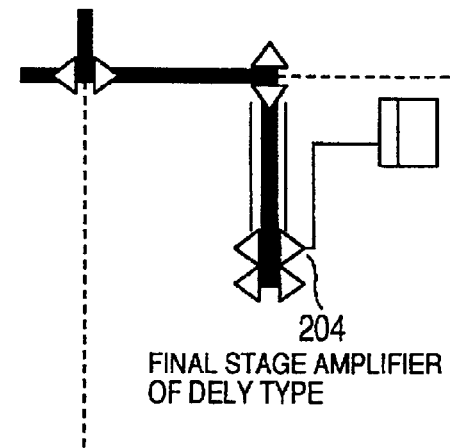
Figure 3A:
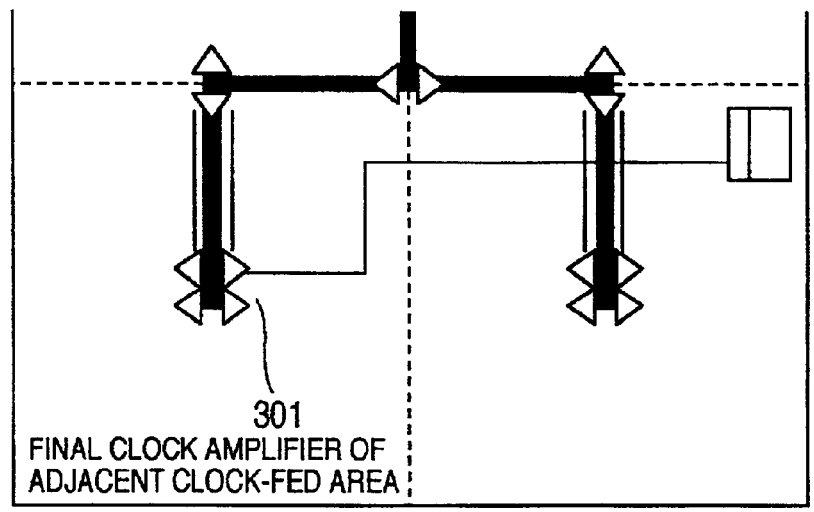
FIGS. 3A to 3B are diagrams illustrating further other examples of methods of delaying the clock-timing of the flip-flops.
Figure 3B:
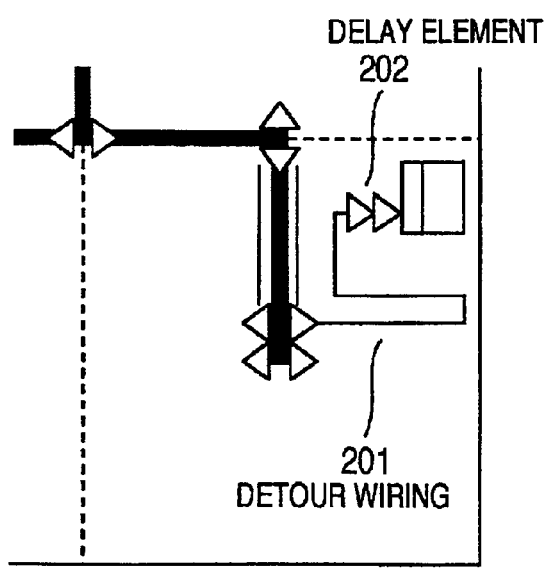

In the methods of adjusting clock timing by controlling clock delay as described above, a plurality of kinds of adjusting methods can be combined to be applied to one flip-flop, thereby permitting expansion of the adjustable ranges of clock delay and also permitting the continuous controlling of the range which has been only discretely controllable. Reference numeral 506 denotes an adjustable range by the method shown in FIG. 3B and described with reference to it, in which the methods shown in FIG. 2A and FIG. 2B are combined. Reference numeral 506-1 denotes an adjustable range of clock delay in case of inserting a delay element of one stage and providing detour wiring, reference numerals 506-2 and 506-3 denote adjustable ranges in case of inserting delay elements of two stages and providing detour wiring and in case of inserting delay elements of three stages and providing detour wiring, respectively.

Figure 5B:
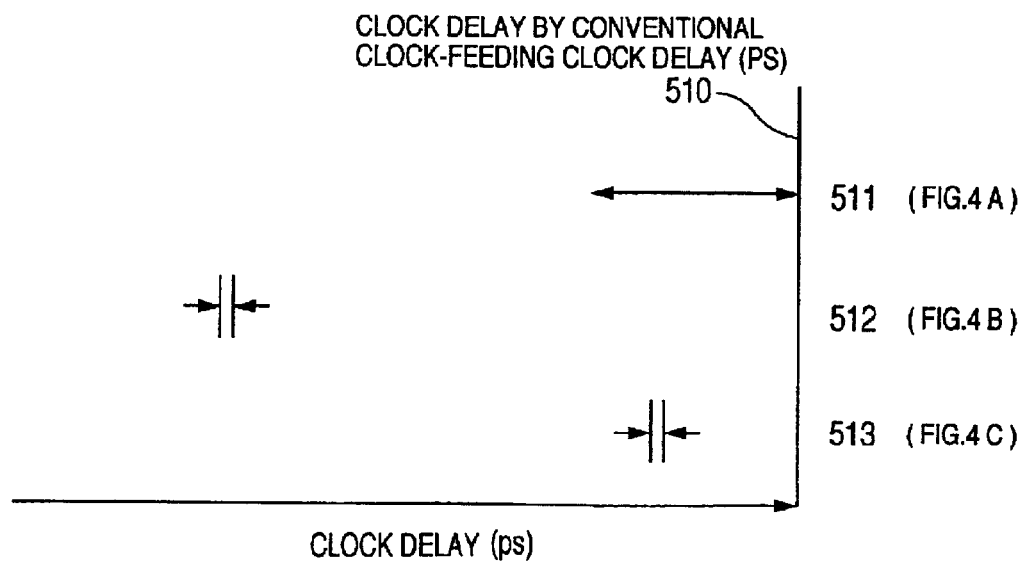

Also, FIG. 5B shows the adjustable ranges of clock delay corresponding to each of the methods of decreasing clock delay described with reference to FIGS. 4A to 4B. Therein, the adjustable ranges are within the ranges indicated by arrows, which are shown relative to clock delay in a conventional clock-feeding method denoted as reference numeral 510. In FIG. 5B, reference numeral 511 denotes an adjustable range by the method shown in FIG. 4A. Reference numeral 512 denotes an adjustable range by the method shown in FIG. 4B, which is equivalent to inputting of another clock signal having a phase difference of one clock pulse width. Reference numeral 513 denotes an adjustable range by the method shown in FIG. 4C, in which the time length of clock delay can be discretely controlled by providing a plurality of kinds of final stage amplifiers that are different in time to delay a clock.

FIG. 6 is a flow chart illustrating processing operations in the design method of semiconductor integrated circuits according to one embodiment of the present invention. Hereinafter, this flow chart will be described. The processing flow described here shows an example of processing operations in a design method of minimizing design modification for higher-speed operation, wherein physical design and packaging design of semiconductor integrated circuits are performed by using a plurality of clock-delay-adjusting methods as described with reference to FIGS. 2A to 2D to FIGS. 4A to 4C for the distributing circuit of a clock signal as shown in FIG. 1. As input data for carrying out this processing, there are provided: an information file 601 including layout position information of cells, terminal-to-terminal connection relation information of cells, and wiring pattern information, an information file 602 including clock delay designation information with respect to flip-flops having clock delay determined already or not to be shifted, an information file 603 including delay calculation information for calculating delay of paths, an information file 604 including clock-delay-adjusting methods, fluctuation values of clock delay by the methods, and clock-delay-adjusting costs for adjusting clock delay, and target machine cycles (MC) 605.s (1) First, the above various kinds of information files 601 to 605 provided as input data are input, and then maximum delay time (DMAX) and minimum delay time (DMIN) required for data transmission along all flip-flop-to-flip-flop paths are determined (steps 610 and 611).

(2) An adjustable range of clock delay is determined from both the input clock delay designation information 602 and the clock-delay-adjusting methods, included in the information file 604, capable of being adopted by each flip-flop (step 612).

(3) Next, one path is selected, and a closed loop returning from the end point flip-flop of the selected path to its starting point flip-flop is extracted, and then a total delay (DLY) of delay in each path in the closed loop and a cycle number (CYC) required for data transmission along the closed loop are determined (steps 613 to 615).

(4) It is judged whether or not the data transmission along the closed loop extracted in step 614 is possible in the target machine cycle or not. This judgement is performed in such a manner that the product of the target machine cycle MC 605 input and the cycle number CYC required for the data transmission along the closed loop, determined in step 615, may be compared with the total delay DLY of delay in each path in the closed loop determined in step 615. That is, when DLY>MC×CYC is held, NO is judged (step 616).

(5) If the judgement of step 616 is NO, the information of the paths in the closed loop is displayed. Then, based on this information displayed, designers perform changes of cells and changes of connection relations of pins as logic modifications, or moves of layout positions of cells and modifications of wiring patterns as modifications of packaging results, and thus feed back the results to the information file 601.

(6) When the judgement of step 616 is YES, a clock-delay-adjusting range is set to each path, which permits data transmission to each flip-flop so as to satisfy the constraints shown in the following:

MC×CYC (PATH)−CLK (S.FF) MAX+CLK (E.FF) MIN>DMAX

MC×(CYC (PATH)−1)−CLK (S.FF)MIN+CLK (E.FF) MAX<DMIN, wherein CYC (PATH) is the cycle number required for data transmission along the path concerned, CLK (S.FF) MIN and CLK (S.FF) MAX are the clock-delay-adjusting ranges of the starting point flip-flop, and CLK (E.FF) MIN and CLK (E.FF) MAX are the clock-delay-adjusting ranges of the end point flip-flop.

The clock-delay-adjusting range of each flip-flop is set to satisfy the constraints described above and to be within the clock delay adjustable range of each flip-flop determined in step 612. However, the clock-delay-adjusting range of a flip-flop of which clock delay is designated should be set within the designated range (step 619).

(7) Whether data transmission is possible in the target machine cycle or not is judged based on the constraints of the clock delay adjustable range of each flip-flop, and, if impossible, the processing of steps 617 and 618 described above is performed (step 620).

(8) If data transmission in the target machine cycle is possible in the judgement of step 620, it is checked whether a not-yet-set path remains or not. If a not-yet-set path remains, the process selects a next path and returns to the processing of the step 614, and repeats the processes of step 614 and later (steps 621 and 622).

(9) If the setting of clock delay has been completed for all paths in the check of step 621, the clock-delay-adjusting ranges set to each flip-flop are output to the clock delay setting information file 631 and processing is completed (step 630).

Then, after completion of these processes, the embodiment of the present invention gradually decreases the time of one period of the target machine cycle 605 and again repeats the processes from step 610, thereby permitting determination of a feasible minimum machine cycle.

FIG. 7 is a flow chart illustrating processing operations for adjusting the clock delay of each flip-flop at minimum cost, and this will be described hereinafter. The example described here is an example permitting the realizing of clock delay set to each flip-flop at minimum cost, wherein physical design and packaging design of semiconductor integrated circuits are performed by using a plurality of clock-delay-adjusting methods as described with reference to FIGS. 2 to 4 for the distributing circuit of a clock signal as shown in FIG. 1. Then, as input data for carrying out this processing, the following are provided: the information file 601 including layout position information of cells, terminal-to-terminal connection relation information of cells, and wiring pattern information, the information file 604 including clock-delay-adjusting methods, fluctuation values of clock delay by the methods, and clock-delay-adjusting cost for adjusting, the target machine cycles (MC) 605, which have been also used in the processing of FIG. 6, and the clock delay setting information file 631 created in the processing of FIG. 6.

(1) First, the data of the above various kinds of information files 601, 604, 605, and 631 provided as data are input, all flip-flops are divided among the clock-fed areas, and one clock-fed area is selected (steps 710 to 712).

(2) All possible combination cases of clock-delay-adjusting methods capable of realizing the clock-delay-adjusting ranges set to all flip-flops in the area are listed up, and groups of flip-flops are created in the order in which the clock-delay-adjusting range of the flip-flops can be realized by clock-delay-adjusting method realizable at minimum cost, and the clock-delay-adjusting method of those flip-flops is determined. At this time, a limit to wiring length are provided for the methods of adjusting clock timing by extending wiring length, and then the methods of using wiring lengths longer than the limit are not adopted (steps 713 to 715).

(3) If the setting range of a selected flip-flop is not less than the adjusting range of the determined clock-delay-adjusting method, the required clock delay can not be realized by one clock-delay-adjusting method, and thus the combination of the determined method with a plurality of clock-delay-adjusting methods is necessary. Therefore, a difference between the setting range of the selected flip-flop and the adjustable range of the selected adjusting method is updated as the setting range of the flip-flop, and further the possibility of realization by a next clock-delay-adjusting method is checked (steps 715 to 717).

(4) It is checked whether or not all flip-flops in the clock-fed area have adjusted clock delay into their setting ranges. If not adjusted, the clock-delay-adjusting method of the second smallest cost is selected, and then the processes from the step 715 are repeated (steps 716 and 717).

(5) If the check of step 716 judges that the adjusting of all the flip-flops in the clock-fed area has been completed, it is checked whether the processing of all the clock-fed areas has been finished or not. If not yet finished, a next clock-fed area is selected, and the processes of step 713 and later are repeated (steps 718 and 719).

(6) If step 718 judges that the processing of all the clock-fed areas has been finished, according to the clock-delay-adjusting method determined, modifications are performed by inserting and deleting of a delay element, replacing of a clock cell, changing of connection relation in a clock network, and detouring of clock wiring or the like as shown in FIG. 2 and FIG. 3, and the results are fed back to the information file 601 as input information (steps 720 and 721).

The embodiment of the present invention described above can perform physical design and packaging design premised on the adjusting of clock timing of flip-flops. In this case, among flip-flop-to-flip-flop paths exceeding target machine cycle, only the paths along which data transmission can not be performed in the target machine cycle by the adjustment of clock timing may be targeted for a design change for reducing delay time of the paths. According to the embodiment of the present invention described above, this can minimize the number of man-hours required for a change of physical design including reduction of a logic stage and reduction of fan-out number and a modification of packaging design including modification of a cell layout and a wiring pattern.

Also, since the embodiment of the present invention described above has a high degree of accuracy of adjusting clock delay, it permits reliable realization of target clock timing, design without backing at hand, and more reliable assurance of operation on semiconductor integrated circuit chips manufactured.

Further, according to the embodiment of the present invention described above, cost is defined as the number of clock gates and the amount of materials of clock wiring or the like, thereby permitting adjusting of clock timing that is fittest for a target manufacturing process of semiconductor integrated circuits and is of minimum cost.

It should be further understood by those skilled in the art that the foregoing description has been made on embodiments of the invention and that various changes and modifications may be made in the invention without departing from the spirit of the invention and the scope of the appended claims.

What is claimed is:

1. A method of designing a semiconductor integrated circuit, comprising the steps of:

dividing a chip of a semiconductor integrated circuit into a number of areas and providing a plurality of clock pins for each of the areas;

performing distribution of a clock signal from a clock source pin to each of the areas in a transmission form that is of high-speed and resistant to noise; and performing adjustment of a clock timing for each flip-flop in the semiconductor integrated circuit such that flip-flop-to-flip-flop data transmission can be performed in a target machine cycle, wherein a plurality of kinds of methods having different adjustable ranges are used as methods of adjusting timing of the clock signal input to said flip-flop, the flip-flops are grouped for each clock timing required by each flip-flop in said area, and each group of said flip-flops grouped for each clock timing is connected to a separate clock pin and adjusted in each clock timing required by each flip-flop.

2. The method of designing a semiconductor integrated circuit according to claim 1, wherein in using a method of adjusting clock timing by extending wiring length, a limit is provided for the wiring length.

3. The method of designing a semiconductor integrated circuit according to claim 2, wherein said method of designing is combined with another different method of adjusting timing.

4. The method of designing a semiconductor integrated circuit according to claim 1, wherein the clock timing of each flip-flop extracts a closed loop consisting of a plurality of signal propagation paths according to maximum delay time, minimum delay time and the target machine cycle required for data transmission along each flip-flop-to-flip-flop signal propagation path, and with respect to each flip-flop in said closed loop, selects a clock timing of each flip-flop among clock timings that can be adopted by said each flip-flop so that data transmission can be performed in said target machine cycle and in a cycle number required for data transmission along said closed loop.

5. The method of designing a semiconductor integrated circuit according to claim 4, wherein said method extracts a signal propagation path or a closed loop along which flip-flop-to-flip-flop data transmission is not performed in said target machine cycle by the adjusting of said clock timing, and when a maximum delay time required for data transmission along the signal propagation path or the closed loop thus extracted is larger than a product of said target machine cycle and said cycle number required for data transmission along said closed loop, performs modification as so to shorten the maximum delay time required for data transmission along the signal propagation path or the closed loop thus extracted, while when a minimum delay time required for data transmission along the signal propagation path or the closed loop thus extracted is smaller than a product of said target machine cycle and a value smaller by one than said cycle number required for data transmission along said closed loop, performs modification so as to elongate the maximum delay time required for data transmission along the signal propagation path or the closed loop thus extracted.

6. The method of designing a semiconductor integrated circuit according to claim 4, wherein the clock timing of each flip-flop is determined while gradually decreasing said target machine cycle, thereby determining a feasible minimum machine cycle.

7. A method of designing a semiconductor integrated circuit, comprising the steps of:

providing an information file 1 including layout position information of cells, terminal-to-terminal connection relation information of cells, and wiring pattern information; an information file 2 including clock delay designation information; an information file 3 including delay calculation information for calculating delay of paths; an information file 4 including clock-delay-adjusting methods, fluctuation values of clock delay caused by the adjusting methods, and clock-delay-adjusting costs by the adjusting methods; and target machine cycles (MC);

inputting information of said information files 1, 2, 3, and 4 and said target machine cycles (MC);

determining maximum delay time (DMAX) and minimum delay time (DMIN) required for data transmission along all flip-flop-to-flip-flop signal propagation paths;

determining a clock delay adjustable range from the clock delay designation information input and the clock-delay-adjusting methods being adopted by each flip-flop in said information file 4;

selecting one path, extracting a closed loop returning from the end point flip-flop to the starting point flip-flop of the selected path, and determining the total delay (DLY) of delay in each path in the closed path and a cycle number (CYC) required for data transmission along the closed loop; and judging whether data transmission along said closed loop is possible in the target machine cycle or not, and if the judgement is NO, displaying information of the paths in the closed loop judged as the NO.

8. The method of designing a semiconductor integrated circuit according to claim 7, further comprising the step of:

performing logic modification or packaging modification based on the information of a path in said displayed closed loop; and feeding back the modification results to said information file 1.

9. A method of designing a semiconductor integrated circuit, comprising the steps of;

providing an information file 1 including layout position information of cells, terminal-to-terminal connection relation information of cells, and wiring pattern information; an information file 2 including clock delay designation information; an information file 3 including delay calculation information for calculating delay of paths; an information file 4 including clock-delay-adjusting methods, fluctuation values of clock delay caused by the adjusting methods, and clock-delay-adjusting costs by the adjusting methods; and a memory including target machine cycles (MC);

inputting information of said information files 1, 2, 3, and 4 and said memory;

determining maximum delay time (DMAX) and minimum delay time (DMIN) required for data transmission along all flip-flop-to-flip-flop signal propagation paths;

determining a clock delay adjustable range from the clock delay designation information input and the clock-delay-adjusting method being adopted by each flip-flop in said information file 4;

selecting one path, extracting a closed loop returning from the end point flip-flop to the starting point flip-flop of the selected path, and determining the total delay (DLY) in each path in the closed loop and a cycle number (CYC) required for data transmission along the closed loop; and judging whether the data transmission along said closed loop is possible in the target machine cycle or not, and if the judgement is YES, setting a clock-delay-adjusting range permitting data transmission to each flip-flop so as to satisfy a predetermined restraint for each path.

10. The method of designing a semiconductor integrated circuit according to claim 9, wherein the step of setting said clock-delay-adjusting range satisfies the following restraints for each path, and sets the clock-delay-adjusting range of each flip-flop within said determined clock delay adjustable range of each flip-flop, $MC \times CYC$ (PATH)$-$CLK (S.FF) MAX$+$CLK (E.FF) MIN$>$DMAX $MC \times (CYC$ (PATH)$-1)-$CLK (S.FP) MIN$+$CLK (B.FF) MAX$<$DMIN, wherein MC: target machine cycles per a second, CYC (PATH): the cycle number required for data transmission along the path concerned, CLK (S.FF) MIN, CLK (S.FF) MAX: a minimum value and a maximum value of the clock-delay-adjusting range of the starting point flip-flop, respectively, and CLK (E.FF) MIN, CLK (E.FF) MAX: a maximum value and a maximum value of the clock-delay-adjusting range of the end point flip-flop, respectively.

\* \* \* \* \*